United States Patent [19]
Bomba

[11] 3,962,640
[45] June 8, 1976

[54] FREQUENCY SELECTION AND CONTROL

[75] Inventor: Steven J. Bomba, Dallas, Tex.

[73] Assignee: Texas Instruments Incorporated, Dallas, Tex.

[22] Filed: Sept. 9, 1974

[21] Appl. No.: 504,626

[52] U.S. Cl. .............................. 325/421; 325/470; 334/11
[51] Int. Cl.² ........................................ H04B 1/32
[58] Field of Search ........................ 334/11, 14–16, 334/18; 325/453, 464, 476, 470, 469, 421, 458–459, 418–423, 461, 468; 178/5.8 AF; 331/178, 179, 14, 18, 19

[56] References Cited
UNITED STATES PATENTS

| | | | |
|---|---|---|---|
| 3,496,473 | 2/1970 | Seppeler et al. | 325/421 X |
| 3,859,599 | 1/1975 | Peil | 325/419 |
| 3,864,636 | 2/1975 | Fukuda et al. | 325/470 X |

*Primary Examiner*—Robert L. Griffin
*Assistant Examiner*—Robert Hearn
*Attorney, Agent, or Firm*—Harold Levine; James T. Comfort; James O. Dixon

[57] ABSTRACT

An automatic oscillator frequency control is provided for operations such as employed in channel selection in radio and television receiver systems. A code is stored representative of a selected frequency band within which a selected channel is located. The frequency of an oscillator is varied monotonically from a reference frequency at one extremity of a selected frequency range successively to traverse a plurality of such frequency bands. A frequency marker is generated at the margin of each band and the markers are counted. The number of counted markers is compared with the stored code to generate a control state. In response to the control state, a pattern control causes it to dither between limits of the selected band until a signal is encountered at the selected frequency within the selected band. At that point, the oscillator is locked to the frequency of the received signal.

In a preferred embodiment, the frequency markers are generated by use of an interferometer, preferably of the surface wave device type wherein a pair of sensor arrays are spaced to sense acoustic waves at the oscillator frequency and are mixed to produce voltage nulls at the margin of each of a plurality of frequency bands of uniform width. Three control loops are provided, an acquisition loop, a control loop and a tracking loop. The loops are asynchronous and provide for operation without imposition of critical time responses in the manual control thereof.

9 Claims, 5 Drawing Figures

FREQUENCY SELECTION AND CONTROL

FIELD OF THE INVENTION

This invention relates to the automatic control of an oscillator frequency in a tuning system wherein the characteristic response time of a frequency acquisition loop, a tracking loop, and an operator control loop are independent of one another.

In a more specific aspect, and in one embodiment thereof, the invention relates to the control of an oscillator in a radio frequency system.

PRIOR ART

Prior art systems employing variable frequency oscillators include AM and FM radio systems. Such variable frequency oscillators are employed not only in receiver systems but also in the selection of frequencies for transmission at a transmitting station. In citizen band radio systems, for example, a single crystal controls the transmission frequency as well as the frequency of the signals to be received.

In commercial television systems, frequency selection is accomplished through the use of a turret tuning system wherein various frequencies are preselected by the physical construction of elements in a switching turret. In other systems, provision has been made for the generation of frequency setting control functions spaced along the frequency scale at preselected intervals corresponding to the bands to which the tuning is to be achieved.

Tuning systems of the turret or of the frequency set type have inherent critical time response limitations, are limited to fixed frequency bands of operation, and require periodic alignment of frequency selection circuits. Further, in UHF and VHF systems operating in the range of from 50 MHz to 890 MHz, prior art techniques of construction render the cost of such systems prohibitive for general consumer applications.

The present invention, in a preferred embodiment, employs an SWD interferometer in an acquisition loop to control the frequency of oscillation of a wide band voltage-controlled oscillator embodied in a tuning system adaptable to integration circuit techniques and low construction cost.

SUMMARY OF THE INVENTION

The present invention is directed to the provision of a tuning system comprising a voltage-controlled oscillator (VCO) to acquire and lock-on a selected operating frequency. More particularly, there is provided a system including a VCO, an interferometer, a low level detector, a dither control unit and a ramp voltage generator operably connected in a closed loop. The VCO frequency is applied to the interferometer acting in conjunction with the low level detector to produce equally spaced frequency markers across the band over which the VCO operates. The dither control unit varies an up/down output characteristic of the ramp voltage generator to pendulate the VCO frequency between frequency markers, and to increment or decrement the VCO frequency by frequency steps or windows as defined by the frequency markers.

Acquisition of a selected frequency is accomplished by incrementing the VCO a number of frequency marker from a reference frequency as defined by the contents of a storage means. As the ramp generator drives the VCO upward from the reference frequency, a counter is provided to count the frequency markers generated by the interferometer and low level detector. Upon coincidence, comparator means responsive to both the storage means and the frequency marker counter tranfers control of the ramp voltage generator from the dither control unit to an AFC control loop.

In one aspect of the invention, an SWD interferometer is used in an acquisition loop of a tuning system which is capable of being constructed principally in integrated circuit form at relatively low cost.

In a further aspect, the invention is directed to a system in which the versatility thereof permits its use in both transmitters as well as receivers over a wide frequency range, and in which manual control may be employed without imposing the necessity of critical time responses in carrying out a tuning operation.

DESCRIPTION OF DRAWINGS

For a more complete understanding of the present invention and for further objects and advantages thereof, reference may now be had to the following description taken in conjunction with the accompanying drawings in which.

DESCRIPTION OF PREFERRED EMBODIMENTS

Figure 1:
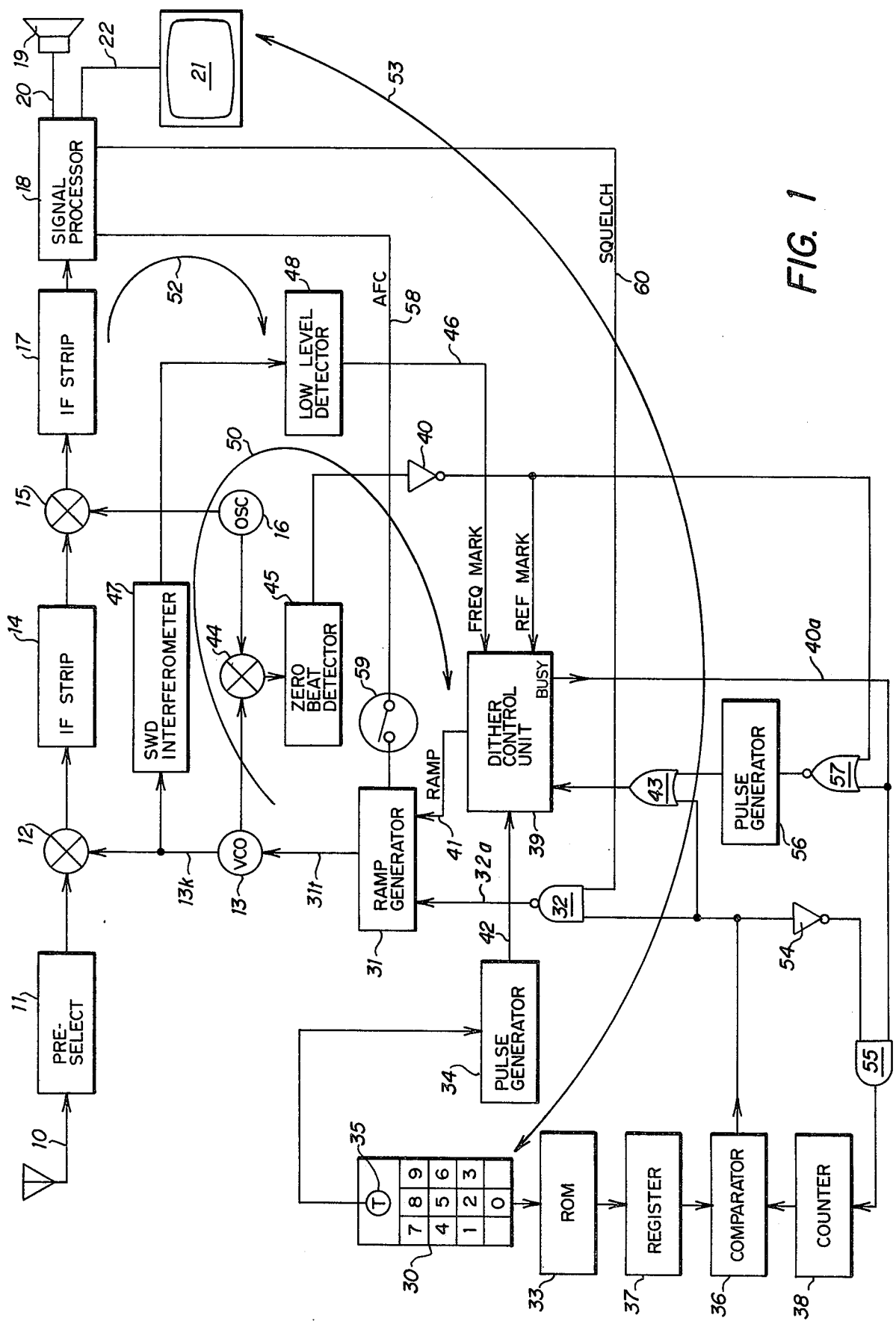
FIG. 1 is a block diagram of a television receiver system embodying the invention.

Referring to FIG. 1, a television tuning system is illustrated which embodies the present invention. The system has been adopted for illustration because of the unique applicability of the invention to tuning any TV channel in the television broadcast band as well as in the cable television band.

A signal from antenna 10 is passed through a preselect unit 11 and thence to a first mixer 12. The mixer 12 is provided with a second input from a voltage controlled oscillator 13. The present invention is directed to the control of the frequency of the oscillator 13 in selecting the frequency of operation of the total system.

Before describing the particular manner in which oscillator 13 operates, the other components of the basic receiver system will be briefly described. The output of mixer 12 is applied to a first IF strip 14, within which the product signal from mixer 12 is amplified and filtered in accordance with conventional techniques. The output of strip 14 then is applied to a second mixer or detector 15. The second input of mixer 15 is supplied from a second oscillator 16, which is a stable and accurate fixed frequency oscillator. The system thus formed is representative of double conversion superheterodyne systems wherein the output of the mixer 15 is applied to a second IF strip 17. The double conversion, as is well known, provides for a higher frequency first IF to reduce the image response of the system, i.e., the response to unwanted frequencies produced in the first mixer 12.

The output of the second IF strip 17 is applied to a conventional signal processing unit 18, which in turn applies an audio signal to a speaker 19 by way of channel 20 and a video signal to a display tube 21 by way of channel 22.

As before described, the oscillator 13 is a voltage controlled oscillator (VCO). VCO 13 is varied in frequency by the output of a ramp voltage generator 31, which is controlled by the output of a stop-go NAND gate 32. One input of gate 32 is connected by way of channel 60 to a squelch output of processing unit 18. A second input of gate 32 is provided by the output of comparator 36.

One input of comparator 36 is supplied from a register 37 which stores a ROM 33 output which output is representative of the number of frequency markers, less one, from a reference frequency marker to the channel to be tuned. Manual actuation of a keyboard 30 selects a given channel, generally identified by a channel number. This causes the storage in register 37 of a code which represents the number of frequency markers, less one, between a reference frequency and the selected channel. A second input to comparator 36 is supplied by a counter 38, which in turn is activated from a dither control unit 39 by way of busy signal channel 40a and an AND gate 55. A second input to NAND gate 55 is supplied by comparator 36 by way of inverter 54.

The dither control unit 39 has an output channel 41 which supplies up/down command to a monotonic ramp voltage generator 31. An input to control unit 39 is supplied by a pulse generator 34 by way of channel 42. A reference frequency marker input is supplied by inverter 40. A pulse generator 34 is activated by depressing a tune key 35 associated with keyboard 30. The reference frequency marker is generated by applying the outputs of VCO 13 and oscillator 16 to a mixer 44, the output of which is applied to a zero beat detector 45 so that there is a voltage null applied to inverter 40 each time that the VCO 13 frequency corresponds with the reference frequency of oscillator 16.

A third input to dither unit 39 is supplied by way of channel 46 leading from a low level detector 48, which in turn receives an input from an interferometer 47. The input to interferometer 47 is supplied by the output of VCO 13. Thus, there is applied to dither unit 39 information as to the edges of each band of frequencies through which VCO 13 passes in response to generator 31.

In the present form, the interferometer 47 is a surface wave device which is so connected and operated in the system as to produce output markers at selected frequencies across the band over which VCO 13 is caused to pass. In general, the interferometer may be any device such as, for example, a filter, the effect of which is to channelize the operational frequency band of VCO 13 and to provide an output marker at selected points within the band. However, because of the adaptability to integrated circuit techniques and precise tuning procedures, the satisfactory operating characteristics at VHF and UHF frequencies, and the small area requirements and low manufacturing costs, SWDs such as that described in copending application Ser. No. 503,943, filed Sept. 5, 1974 by J. D. Holms et al, are preferred.

An increment signal input is supplied to dither unit 39 by OR gate 43. Gate 43 has one input connected to an input of NAND gate 32 and to the output of comparator 36. Gate 43 has a second input connected to the output of a pulse generator 56. Pulse generator 56 in turn is driven by a NOR gate 57, the input of which are supplied by inverter 40 and by dither unit 39 by way of channel 40a.

When a selected channel frequency has been acquired, control of ramp generator 31 is transferred from dither unit 39 to signal processor 18. More particularly, the output of NAND gate 32 actuates a switch 59, typically a CMOS switch, connecting an AFC channel 58 from processor 18 to generator 31. The acquisition of a selected frequency is characterized by concurrent logic one states on the outputs of comparator 36 and on the squelch output of processor 18. The output of NAND gate 32 thus transitions to a logic zero state causing CMOS switch 59 to close and effecting a transfer of control from dither control unit 39.

The system illustrated in FIG. 1 includes three feedback loops, the first of which is an acquisition loop indicated by arrow 50. The second loop is a frequency lock or tracking loop 52, and the third is an operator control loop 53. The characteristic response times of the acquisition loop, the tracking loop and the control loop are all independent of one another and are related only asynchronously. Comparatively, the acquisition loop 50 has the highest response rate while the control loop 53 has the lowest response rate.

It will be recognized that the low response rate of control loop 53 is attributed to human intervention. More particularly, as the channel selection information is entered by way of keyboard 30, the operator observes the display 21. If the display is not that desired, then the human responds by entering a new channel selection number.

In operation, a signal is passed from antenna 10 through a broad preselect bandpass filter 11 and applied to mixer 12. The pass band of preselect 11 is sufficiently broad to pass that part of the RF spectrum in which the system of FIG. 1 may operate. Within that RF spectrum, an operator may select a given channel by successively depressing two keys on keyboard 30 representing the two-digit number of the desired channel.

Upon initialization of the system, the dither control unit 39 drives ramp generator 31 and thereby places the frequency of VCO 13 above a reference frequency to be produced by zero beat detector 45.

After system initialization and channel selection from keyboard 30, the tuning sequence is activated by depressing a tune key 35 on the keyboard. Pulse generator 34 is activated by key 35 to apply a pulse along channel 42 to dither control unit 39 to start a reference frequency search. Dither control unit 39 forces the ramp voltage and thus the VCO 13 frequency down to the reference frequency to produce a reference marker which occurs when the frequency of VCO 13 equals that of reference oscillator 16.

When the reference frequency marker is acquired from detector 45, a signal is applied by inverter 40 to NOR gate 57. Pulse generator 56 is thus triggered, which in turn passes a positive going trigger through OR gate 43 to dither unit 39 commanding a VCO 13 frequency incrementation. By means of NOR gate 57, the incrementation process commences immediately upon reaching the reference frequency. Once the process has begun, the dither control unit 39 initiates further frequency increments by means of a busy signal pulse along channel 40a through NOR gate 57 to again trigger pulse generator 56. In addition, the busy signal is applied along channel 40a and through AND gate 55 to trigger counter 38 each time a frequency increment is initiated. As long as comparator 36 remains in a logic zero state characterizing noncoincidence, NAND gate 32 maintains ramp generator 31 in a go condition, and the repetitive process of a busy signal triggering pulse generator 56 and counter 38 continues until the output of comparator 36 transitions to a logic one.

Each of the channels that may be selected by keyboard 30 have a frequency higher than the reference frequency. Thus, in the illustrated embodiment the selected frequency is acquired by repeatedly incrementing the VCO 13 frequency by a frequency difference defined by adjacent frequency markers. More particularly, upon entry of a selected channel number in keyboard 30, a code stored in ROM 33, representing the number of frequency markers, less one, between the reference marker and the desired channel is stored in register 37. As VCO 13 is incremented, each frequency mark that is generated causes a busy signal pulse along channel 40a to increment counter 38 in a manner to be later explained. When the required number of frequency markers are produced, the count retained in counter 38 will be equal to the content of register 37. The output of comparator 36 thus transitions to a logic one state causing through gate 43 an additional increment of VCO 13 at the same time AND gate 55 is closed to further busy signal pulses. Upon the generation of a squelch signal in channel 60 representing the presence of channel information, the output of NAND gate 32 transitions to a logic zero state to close CMOS switch 59 and transfer the control of ramp generator 31 from dither control unit 39 to signal processor 18. AFC channel 58 thus provides a tracking error signal to ramp generator 31 to lock-on the desired frequency.

FIG. 2

During the acquisition process, frequency markers are generated by interferometer 47 acting in conjunction with low level detector 48. In the preferred embodiment herein described, interferometer 47 is a surface wave delay line which is capable of passing energy within each of a plurality of narrow discrete pass bands.

Figure 2:
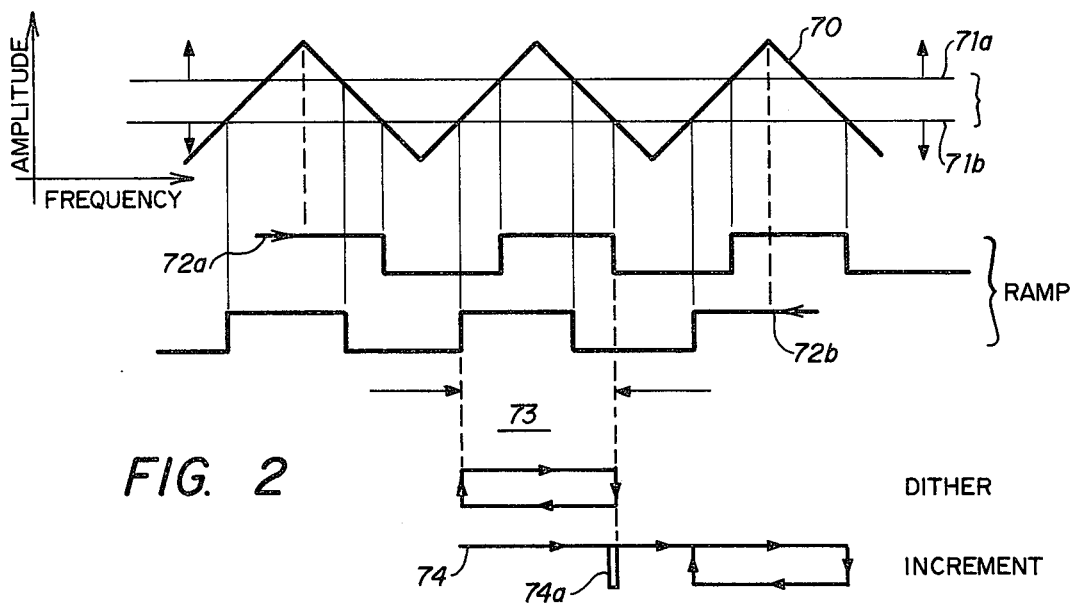
FIG. 2 is a diagram of the output waveforms of the SWD interferometer, the low level detector and the dither control unit embodied in the systems of FIG. 1 and FIG. 2.

More particularly, an ideal output waveform 70 is shown in FIG. 2 for an SWD interferometer having an acoustical delay of one microsecond between interdigitated output transducers. Assuming waveform 70 is applied to low level detector 48, frequency markers are generated any time decision level 71a or decision level 71b intersects output waveform 70. In response to the frequency markers generated on channel 46, dither control unit 39 generates a RAMP control signal on channel 41 to control the up/down character of the ramp generator 31 output. During the generation of a positive going ramp voltage, the RAMP control signal has the form of waveform 72a with negative going edges located by level 71b intersections and positive going edges located by level 71a intersections. In like manner, waveform 72b is applied by dither control unit 39 to generator 31 when a negative going ramp voltage is to be generated. Again, negative going edges are located by level 71b intersections and positive going edges by level 71a intersections.

When generator 31 is to be placed in a dither mode, a negative going edge of waveform 72a, controlling the generation of a positive going ramp voltage, locates the upper frequency marker of a one megaHertz window 73. Further, a negative going edge of waveform 72b, controlling the generation of a negative going ramp voltage, locates the lower frequency marker of window 73.

FIG. 3

Figure 3:
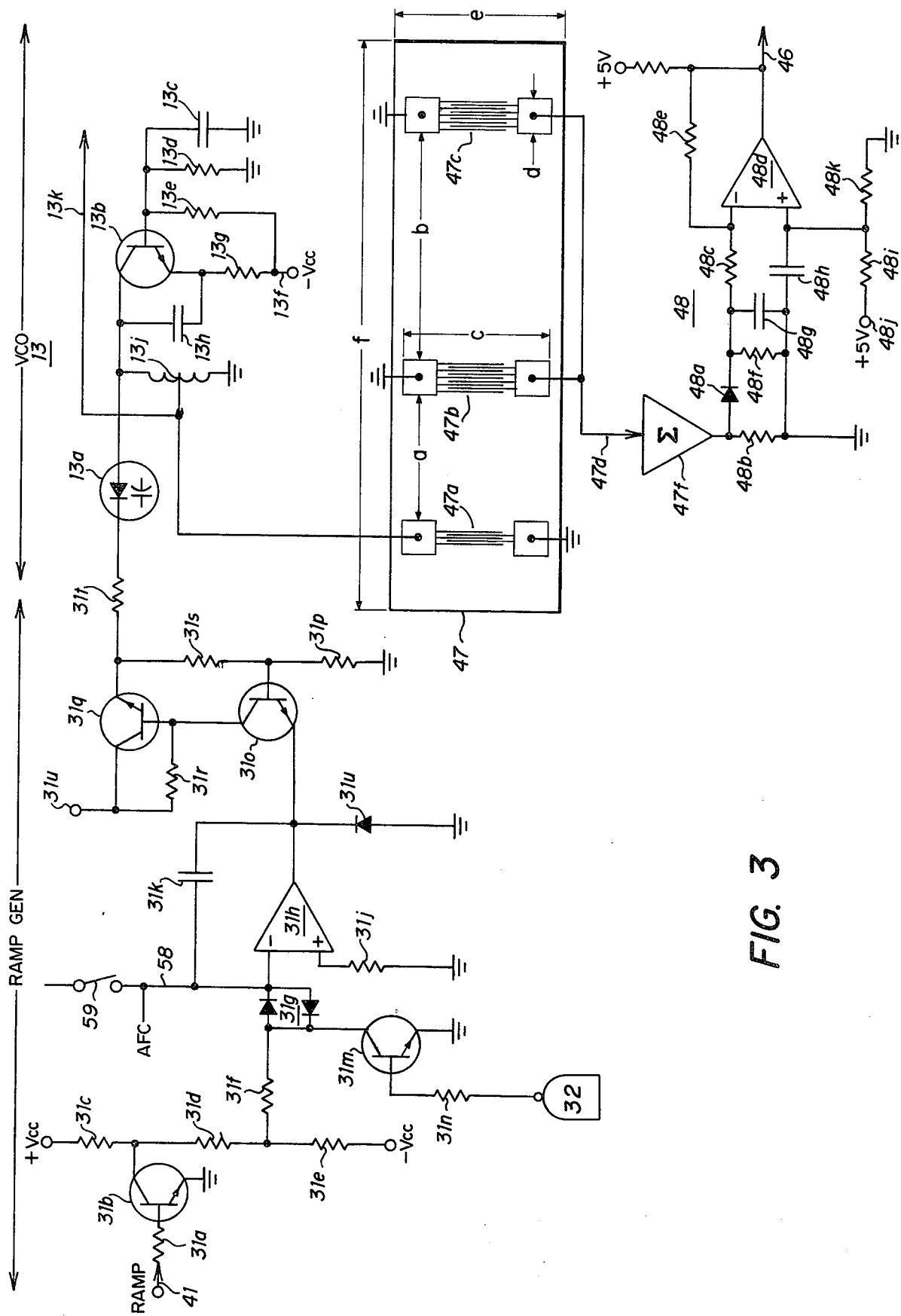
FIG. 3 is a detailed electrical schematic diagram of the ramp voltage generator, the voltage controlled oscillator, the SWD interferometer and the low level detector of FIG. 1.

FIG. 3 is a detailed schematic diagram of ramp voltage generator 31 in electrical communication with VCO 13, interferometer 47 and low level detector 48. In this system, the up/down ramp control channel 41 is connected by way of a resistor 31a to the base of a transistor 31b. The emitter of transistor 31b is connected to ground, while the collector is connected to the juncture between resistors 31c and 31d. Resistor 31d is connected to resistor 31e to form a voltage dividing network with resistor 31c across battery terminals $V_{CC}$ and $-V_{CC}$. The juncture between resistors 31d and 31e is connected by way of resistor 31f to a pair of parallel and oppositely poled diodes 31g.

The output of the circuit 31g is connected to the negative input of an operational amplifier 31h, the positive input of which is connected by way of resistor 31j to ground. The negative terminal of amplifier 31h also is connected to the AFC channel 58 and a capacitor 31k, which in turn is connected across amplifier 31h to serve as an integrating capacitor.

The juncture between resistor 31f and the parallel circuit 31g is connected to the collector of transistor 31m whose emitter is connected to ground, and whose base is connected by way of resistor 31n to a stop-go NAND gate 32, FIG. 1.

The output of amplifier 31h is connected to the cathode of a diode 31u having a grounded anode, and to the emitter of a transistor 31o whose base is connected by way of resistor 31p to ground. The collector of transistor 31o is connected to the base of a transistor 31q, and by way of resistor 31r to the collector of transistor 31q and to a positive voltage terminal 31u. The emitter of transistor 31q is connected to the base of transistor 31o by way of resistor 31s.

The ramp generator 31 supplies a ramp output voltage by way of resistor 31t through a capacitive diode varactor 13a to control VCO 13. VCO 13 is built around a transistor 13b whose base is connected to ground by way of capacitor 13c for A.C. purposes, and to ground by way of a biasing resistor 13d. The base is also connected by way of resistor 13e to a $-V_{CC}$ terminal 13f. The emitter of transistor 13b is connected by way of resistor 13g to terminal 13f, and by way of capacitor 13h to the output of varactor 13a and to the collector of transistor 13b. The collector is also connected through an inductor 13j to ground.

Varactor 13a, capacitor 13h and inductor 13j serve to tune VCO 13 to the frequency characterized by the voltage output of generator 31. The output channel 13k is then available for application to mixer 12, to interferometer 47 and to mixer 44, FIG. 1.

An input from VCO 13 is impressed upon an input interdigitated transducer 47a of SWD interferometer 47, thereby exciting surface acoustical waves in the SWD substrate which propagate in the direction of output transducers 47b and 47c. The two SWD output channels 47d and 47e, which are characterized by predetermined differential delays of the input signal, are applied to the inputs of summing amplifier 47f to channelize the operational frequency band of VCO 13.

The output of amplifier 47f is applied to low level detector 48 to provide output markers on channel 46 corresponding to the edges of the frequency windows through which VCO 13 passes in response to generator 31. More particularly, the output of amplifier 47f is connected to the anode of a diode 48a and through a resistor 48b to ground. The cathode of diode 48a is connected through a resistor 48c to the positive input of a bipolar amplifier 48d, and through a resistor 48e to the output of amplifier 48d. The cathode of diode 48a also is connected through a parallel RC circuit comprising resistor 48f and capacitor 48g to ground. The negative input of amplifier 48d is connected through a capacitor 48h to ground, through a resistor 48i to a positive voltage terminal 48j, and through a resistor 48k to ground.

FIG. 3 functionally may be understood by noting that it is comprised of a bi-directional current source which includes transistor 31b, a current shunt 31m isolating diodes 31g, an AFC switch 59 on integrator 31h, 31k with its output clamped by diode 31u. The output never goes far below ground. A voltage amplifier 31g–31o applies the output voltage of the integrator through an RF isolation resistor 31t to a voltage controlled oscillator 13. This generates radio frequencies which are applied to an acoustic mode interferometer (AMI) and detected by a low level detector circuit which in turn applies signals to a Schmitt trigger 48d.

FIG. 4

Figure 4:
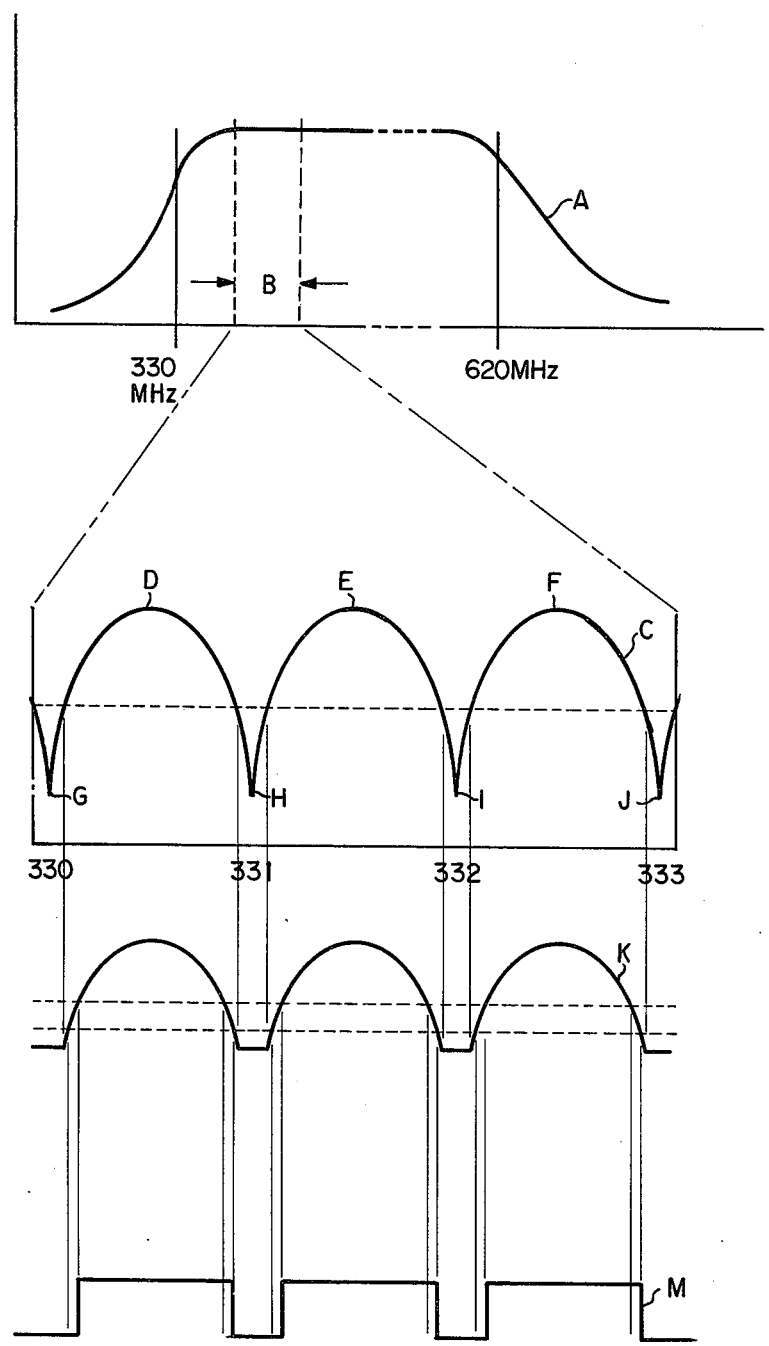
FIG. 4 illustrates operation of the system of FIG. 3.

From FIG. 4, curve A represents the response of the interferometer 47 of FIG. 3 as employed in the present invention. The curve A has a relatively high response over the frequency band of from 300 MHz to 620 MHz. Thus, it serves as a band pass filter. The 3 db points are at 330 and 620 MHz. The response curve A is flat over the band to within ±2 db. While the curve A is indicated as a smooth curve, it is to be understood that because of the fact that the transducers 47b and 47c are combined, the actual response curve is regularly divided by high attenuation points.

In order to illustrate the latter features, the short segment B of the response curve A of FIG. 4 is enlarged in curve C. Maximum response peaks D, E and F in curve C are separated by deep nulls G, H, I and J. Thus, a signal of the character represented by curve C is produced at the output of amplifier 47f. This signal is then applied by way of diode 48a so that a voltage represented by the waveform K is applied to the input of filter 48f, 48g. The filter output voltage developed across capacitor 48g is then applied to the two inputs of amplifier 48d. This produces an output represented by waveform M, FIG. 4 on line 46. Pulses represented by the waveform M control a Schmitt trigger in the dither circuit 39.

Because of the fact that the signal level from the oscillator 13 varies as a function of frequency, a tracking circuit is provided at the input of amplifier 48d. This permits the Schmitt trigger to track the D.C. level of the output signal as it varies and yet change state in response to the ripple output of the filter, i.e., in response to the waveform K of FIG. 4. Resistor 48f and capacitor 48g form a filter. The output of the filter appears across capacitor 48g and is coupled into amplifier 48d by way of resistor 48c and capacitor 48h. This circuit permits the Schmitt trigger to follow the D.C. level of the output signal while causing it to change state to produce the output waveform M. In one embodiment of the invention, the elements had the following representative values:

| | |
|---|---|
| resistor 48c | 10 k ohms |
| resistor 48e | 10 megohms |
| resistor 48f | 1 megohm |
| capacitor 48g | 560 picofarads |
| capacitor 48h | 1,000 picofarads |
| resistor 48i | 5 k ohms |
| resistor 48k | 50 k ohms |

The bi-directional current source is provided by controlling the status of transistor 31b. When transistor 31b is in an off condition by holding input line 41 at ground then the node common to resistors 31b, 31e, 31f, is at a potential such that current flow into capacitor 31k is through the isolation diodes 31g. While this is functioning, switch 59 is open so that frequency correction signals are not applied to capacitor 31k. Current flowing into the inverting input of amplifier 31h places a positive charge at the virtual ground side of capacitor 31k and causes the output of the amplifier 31h to go toward ground. Diode 31u may conduct and not allow the amplifier to swing anymore than one diode drop (approximately six-tenths of a volt in silicon) below ground. By causing transistor 31b to conduct, it essentially places said common voltage node in the bi-directional current source at a potential closer to $-V_{CC}$. This reverses the current flow through the diode oscillator and causes capacitor 31k to charge in the opposite direction making the integrator output move positively away from ground. Since the output voltage of amplifier 31h is less than the charge required for full frequency lift of the oscillator, the voltage amplifier comprised of transistors 31g and 31o increases the voltage to charge between approximately 2 and 25 volts. In response, capacitor 13a changes in capacitance from approximately 2 to 10 picofarads.

In conjunction with resonating coil 31j the oscillator of transistor 13b changes its frequency of oscillation. As the frequency of oscillation is changed, it is measured in the acoustic mode interferometer 47. Whenever the wave length is such that transducers 47b and 47c receive phase coherent voltages, voltage maximums D, E, or F appear at the output of amplifier 47f. When the voltages received at transducers 47b and 47c are in phase opposition the resultant voltage would be zero if both transducers 47b and 47c receive the same potential. In actual practice, very nearly the same potentials are sensed so the resultant voltage falls to very low minimums G, H, I, and J. As the frequency applied to transducer 47a continues to increase or decrease, depending on whether capacitor ]3a is increasing or decreasing in capacitance, the resonator 47 continues to produce voltage nulls which are detected by the low level detector. Amplifier 47f is a wide band transistor amplifier. It drives diode detector 48a which is a Schottky barrier diode requiring very low levels to develop DC voltage on filter elements 48f and 48g. The filter output is of the form K FIG. 4 and in turn is fed to the amplifier 48d in which waveform K is squared. The output on line 46 goes to the dither control logic where it is compatible both in rise time and voltage swing. Two ramp control voltages are effective at lines 41 and 32a. The voltage on line 41 determines whether or not the ramp goes up or down by virtue of determining the direction of current flow through the isolation diodes. When the ramp is to stop, the current is merely short circuited to ground by turning on transistor 31m by applying a positive voltage to line 32a. In order to preserve the charge across capacitor 31k, switch 59 is then closed and current flows via the system AFC circuit through line 58 to keep the output of the integrator at a voltage such that the frequency of the oscillator 13 from line 13k is maintained at the proper frequency for signal processing in unit 18, FIG. 1.

Typically, unit 13a may be of the type manufactured and sold by Texas Instruments Incorporated of Dallas, Texas and identified as TIV-21 Silicon Voltage-Variable-Capacitance diode commonly referred to as a VCAP with typical specifications as follows:

$C_{min} \sim 2$ picofarads $\dfrac{C_{max}}{C_{min}} \sim 5$ for $\Delta V_{applied}$ of approximately from 3 to 25 volts Typically, units 31h and 47f may be of the type manufactured and sold by Texas Instruments Incorporated of Dallas, Texas and identified as SN 72741 General-Purpose Operational Amplifier.

FIG. 5

Figure 5:
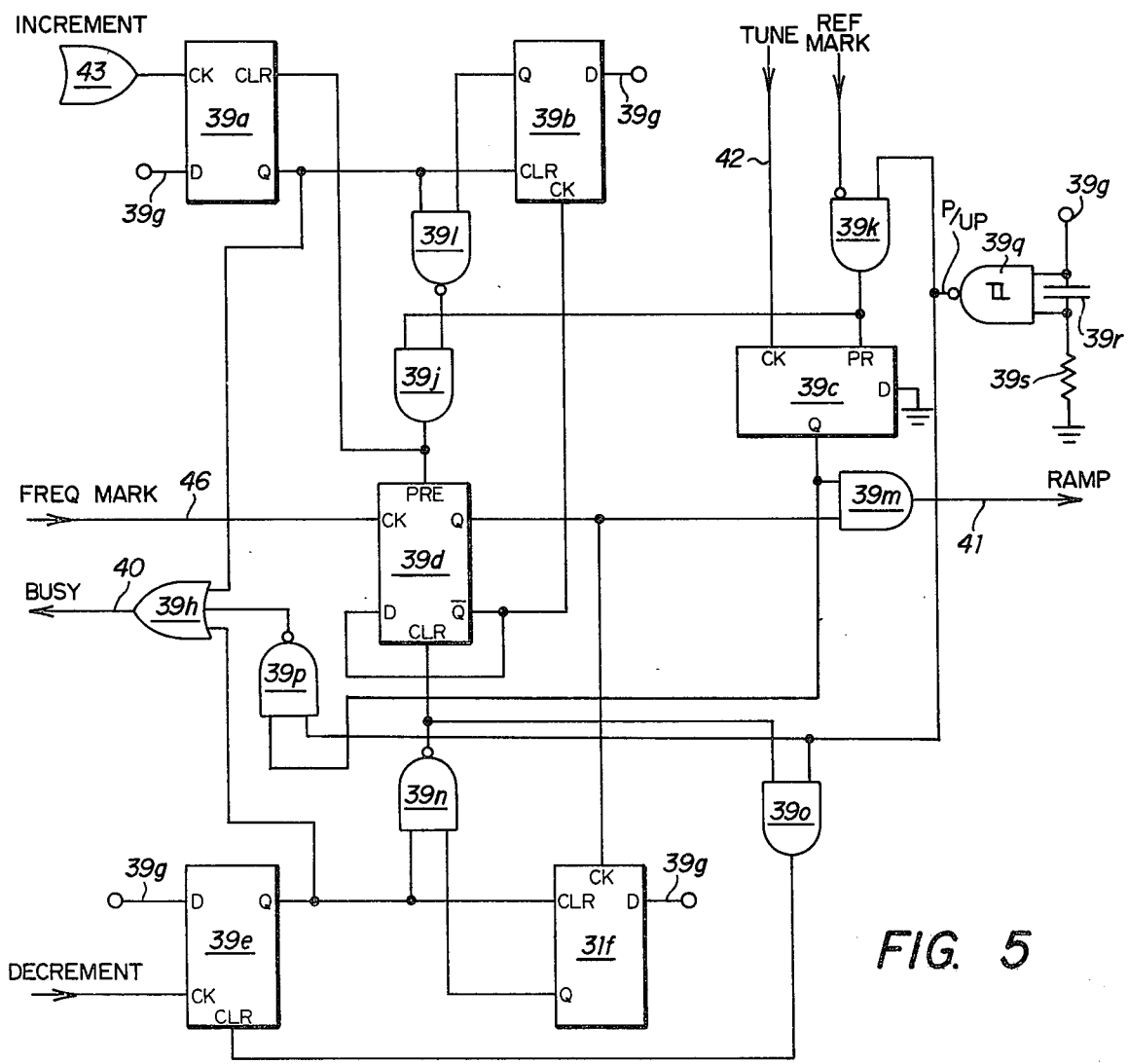
FIG. 5 is a logic circuit diagram of the dither control unit of FIG. 1.

The dither control unit 39 as illustrated in FIG. 5 employs flip-flops 39a–39f to control the character of the output voltage generated by ramp generator 31, and to generate a busy signal which increments counter 38 of FIG. 1. The flip-flops are preferably of type corresponding to SN 7474 TTL, i.e., positive edge triggered D flip-flops manufactured by Texas Instruments, Incorporated., of Dallas, Texas. In operation, a logic zero applied to the preset input of a SN 7474 flip-flop forces the Q output to a logic one state, and a logic zero applied to the clear input forces the Q output to a logic zero state.

Flip-flop 39a has as a clock input signal supplied by OR gate 43 of FIG. 1. The data (D) input to the flip-flop is connected to a voltage source terminal 39g, preferably connected to a five volt source. The clear input of flip-flop 39a is connected to the preset input of flip-flop 39d, while the Q output is connected to one input of OR gate 39h and to the clear input of flip-flop 39b.

The D input of flip-flop 39b is connected to voltage source terminal 39g, while the clock input is connected to the $\overline{Q}$ output and to a D input of flip-flop 39d. The Q output of flip-flop 39b is connected to one input of a NAND gate 39i, the output of which is connected to one input of an AND gate 39j. The second input to NAND gate 39i is supplied by the Q output of flip-flop 39a, while the second input to AND gate 39j is supplied by the output of an AND gate 39k.

The clock signal input to flip-flop 39d is connected by way of channel 46 to the output of low level detector 48, FIG. 1. The Q output is connected to the clock input of flip-flop 39f and to one input of an AND gate 39m, the second input of which is supplied by the Q output of flip-flop 39c. The output of AND gate 39m is the ramp character control signal controlling the up/down characteristic of the ramp output of generator 31.

The D input of flip-flop 39f is connected to voltage source terminal 39g, and the Q output is connected to one input of a NAND gate 39n. The clear input to flip-flop 39f is connected to a second input to NAND gate 39n, to a second input to OR gate 39h, and to the Q output of flip-flop 39e.

The output of NAND gate 39n is connected to the clear input of flip-flop 39d and to one input of an AND gate 39o, the output of which is applied to the clear input of flip-flop 39e.

The D input of flip-flop 39e is connected to voltage source terminal 39g, and the clock input is connected to a Decrement signal channel which is activated during a frequency search mode only. In the embodiment described herein, only a tune mode in which flip-flop 39e plays no functional role has been illustrated. However, in systems where a broad band search is conducted to control a preselector before the tuning process is initiated, the dither control unit illustrated in FIG. 4 may be used without modification.

A third input to OR gate 39h is connected to the output of a NAND gate 39p, the inputs of which are supplied by the Q output of flip-flop 39c and the output of a Schmitt trigger TTL element 39q, preferably a SN 7413 as manufactured and sold by Texas Instruments, Incorporated., of Dallas, Texas. The output of OR gate 39h is applied to NOR gate 57 and AND gate 55 of FIG. 1.

One input of Schmitt trigger 39q is connected to voltage source terminal 39g and to the positive terminal of a capacitor 39r. The second input is connected to the negative terminal of capacitor 39r and through a resistor 39s to ground. The output of trigger 39q is connected to an input to AND gate 39k and to a second input to AND gate 39o.

A second input to AND gate 39k is the inverted output of inverter 40, FIG. 1, supplying a reference frequency mark during a tuning operation. The output of AND gate 39k is applied to a preset terminal of flip-flop 39c, and the D input of flip-flop 39c is grounded. The clock input of flip-flop 39c is supplied by pulse generator 34, FIG. 1, along channel 42.

In operation, the dither control unit illustrated in FIG. 4 undergoes an initial power-up (P/UP) phase before entering into a tune mode of operation. When energized, a positive voltage source is applied to the terminal 39g which raises the inputs to Schmitt trigger 39q to a logic one level. The output of trigger 39q is thus at a logic zero state which is applied to gate 39k and thence to gate 39j. Gates 39k and 39j in turn apply a logic zero state to the present inputs of flip-flops 39c and 39d, respectively. The Q outputs of flip-flops 39c and 39d are thus raised to a logic one state and are applied to AND gate 39m. A logic one state is thereby applied along channel 41 to ramp voltage generator 31 to increase the output frequency of VCO 13.

The positive going ramp is generated for an initialization or P/UP period determined by the time constant of an RC circuit comprising capacitor 39r and resistor 39s. The initialization period is of sufficient length to allow the frequency of VCO 13 to increase at least two frequency markers beyond the reference frequency of oscillator 16.

During the period of initialization, as shown in the first three columns of a logic state diagram in Table 1, the Q outputs of flip-flops 39c and 39d remain in a logic one state as do the outputs of AND gate 39m and OR gate 39h. The Q output of flip-flops 39a, 39b, 39e and 39f remain at a logic zero state throughout the initialization period.

TABLE I

| | P/UP | | | Dither | | | Tune | Dither | | Increment | Dither | | |
|---|---|---|---|---|---|---|---|---|---|---|---|---|---|
| Freq Mark | — | — | — | ∫ | ∫ | ∫ | — | — | ∫ | 1 | ∫ | — | ∫ |
| Ref Mark | 0 | 0 | 0 | 0 | 0 | 0 | 0 | 1 | 0 | 0 | 0 | 0 | 0 |
| Tune | 0 | 0 | 0 | 0 | 0 | 0 | ∫ | 0 | 0 | 0 | 0 | 0 | 0 |
| Dec | 0 | 0 | 0 | 0 | 0 | 0 | 0 | 0 | 0 | 0 | 0 | 0 | 0 |
| Inc | 0 | 0 | 0 | 0 | 0 | 0 | 0 | 0 | 0 | ∫ | 1 | 0 | 0 |
| Busy | 1 | 1 | 1 | 0 | 0 | 0 | 1 | 0 | 0 | 1 | 1 | 0 | 0 |
| Ramp | 1 | 1 | 1 | 0 | 1 | 0 | 0 | 1 | 0/1 | 1 | 0 | 1 | 1/0 |
| Q39c | 1 | 1 | 1 | 1 | 1 | 1 | 0 | 1 | 1 | 1 | 1 | 1 | 1 |
| Q39d | 1 | 1 | 1 | 0 | 1 | 0 | — | 1 | 0/1 | 1 | 0 | 1 | 1/0 |
| Q39f | 0 | 0 | 0 | 0 | 0 | 0 | 0 | 0 | 0 | 0 | 0 | 0 | 0 |
| Q39e | 0 | 0 | 0 | 0 | 0 | 0 | 0 | 0 | 0 | 0 | 0 | 0 | 0 |
| Q39b | 0 | 0 | 0 | 0 | 0 | 0 | 0 | 0 | 0 | 0 | 1 | 0 | 0 |
| Q39a | 0 | 0 | 0 | 0 | 0 | 0 | 0 | 0 | 0 | 1 | 1 | 0 | 0 |

$t_n$ Time →

In TABLE I the symbol (∫) indicates response on the leading edge of the pulse.

When capacitor 39r charges sufficiently to force one input of trigger 39q to a logic zero state, the initialization period ends. Following the time of initialization, the output of trigger 39q transitions to a logic one state to enable the clock inputs of flip-flops 39c and 39d. The Q output of flip-flop 39c remains at a logic one state, while the Q output of flip-flop 39d becomes responsive to the clock signal on channel 46. As the ramp voltage continues to drive the output frequency of VCO 13 upward, a frequency marker input generated by interferometer 47 clocks flip-flop 39d. As the $\overline{Q}$ output of flip-flop 39d is connected to the data input of the flip-flop, the Q output thereby is complemented to cause the gate 39m output to transition to a logic zero state. Thus, a negative going ramp voltage is generated by generator 31, and the output frequency of VCO 13 is caused to decrease until a next positive going edge input on channel 46 causes flip-flop 39d to toggle again.

The frequency output of VCO 13 moves back and forth or dithers in a clockwise direction within a frequency window defined by the SWD interferometer 47 as illustrated in FIG. 2. As is shown in columns 4–6 of Table I, only flip-flop 39d and the RAMP control signal along channel 41 change state during the dither period following the initialization or P/UP period.

When a tune operation is desired, key 35 is depressed to activate pulse generator 34. The output of pulse generator 34 is applied along channel 42 as a TUNE command to the clock input of flip-flop 39c. Referring to Column 7 of Table I, the positive going edge of the pulse generated by pulse generator 34 clocks flip-flop 39c to transition the Q output of the flip-flop to a logic zero state. The output of NAND gate 39p thus transitions to a logic one state as reflected at the output of OR gate 39h. In addition, the output of NAND gate 39m transitions to a logic zero state, causing a negative going ramp to be generated. Thus, the frequency of VCO 13 decreases until a zero beat pulse is generated by detector 45, raising the reference marker input to AND gate 39k to a logic one level. As reflected by column 8 of Table I, the Q output of flip-flop 39c transitions to a logic one state to allow the output of flip-flop 39d to control the direction of the ramp voltage in response to the frequency marker signals on channel 46. As shown in column 9 of Table I, ramp generator 31 is thereby placed in a dither mode in the frequency window located by the reference frequency of oscillator 16.

As the frequency band of operation of the tuning system herein described is never lower than the reference frequency marker, all channels to be selected are located above the reference frequency of oscillator 16. VCO 13 must, therefore, be incremented upward in increments or frequency windows defined by adjacent frequency markers until a logical coincidence occurs in comparator 36.

Immediately upon reaching the reference frequency marker, a pulse is applied by inverter 40 to NOR gate 57, which in turn actuates pulse generator 56, FIG. 1. During the period between the generation of the reference frequency marker and the increment signal, the ramp generator dithers at the reference frequency marker as before described. With the activation of pulse generator 56, a positive going trigger is passed through OR gate 43 to clock flip-flop 39a and command the dither control unit 39 to increment VCO 13 one frequency window. As reflected by column 10 of Table I, the increment signal, which is a positive going transition, causes the Q output of flip-flop 39a to rise to a logic one state which is applied through OR gate 39h as a busy signal to AND gate 55 to increment counter 38, FIG. 1. The logic zero to logic one transition of the busy signal is also applied to NOR gate 57, which acts to delay the triggering of pulse generator 56 until after the busy signal again assumes a logic zero state as shown in column 12 of Table I.

In the illustration of FIG. 5, flip-flop 39b is clocked by the positive going transitions of the $\overline{Q}$ output of flip-flop 39d, while flip-flop 39f is clocked by the positive going transitions occurring at the Q output of flip-flop 39d. Flip-flops 39b and 39f operate in conjunction with flip-flop 39d to control the dither operation of the ramp generator 31. A ramp voltage may thus be dithered in a clockwise direction, incrementing only on positive going edges and decrementing only on negative going edges. Upon flip-flop 39a being clocked by the increment signal applied by OR gate 43, the Q output is raised to a logic one state as reflected by the output of OR gate 39h. As before described, the logic one state is applied to AND gate 55 to increment counter 38, and applied to NOR gate 57 where the activation of pulse generator 56 is delayed. Referring to column 10 of Table I, the Q outputs of flip-flops 39a, 39d and 39c are at a logic one state during this period as is the output of AND gate 39m. The ramp voltage thus continues to force the VCO 13 frequency upward until a next frequency marker is received on channel 46 as shown in column 11 of Table I.

As previously described, the $\overline{Q}$ to D (Data) input connection of flip-flop 39d complements the Q output of flip-flop 39d. Thus, upon receipt of the next succeeding frequency marker, the Q output of flip-flop 39d transitions to a logic zero state. This logic one to logic zero state transition clocks flip-flop 39b to force a preset condition into flip-flop 39d. The Q output of flip-flop 39d thereby is forced back to a logic one state, as shown in column 12 of Table I. The output of AND gate 39m thus transitions to a logic one state to force the continued generation of a positive going ramp, and the output of VCO 13 continues to increase until a next positive going frequency marker on ramp 46 is applied to the clock input of flip-flop 39d.

The setting of a preset condition into flip-flop 39d simultaneously causes a clear condition in flip-flop 39a. Thus, the Q output of flip-flop 39a transitions to a logic zero state which is applied to OR gate 39h to lower the busy signal to a logic zero state. The output of NOR gate 57 thereby transitions to a logic one state to trigger pulse generator 56, and to cause a positive going pulse edge to be transmitted through OR gate 43 to clock flip-flop 39a.

The repetitive zero-one-zero state transitions of the busy signal output of OR gate 39h, as illustrated at portion 74a by waveform 74 of FIG. 2, continues to drive the pulse generator 56 to clock flip-flop 39a through OR gate 43 until comparator 36 reaches coincidence. Upon coincidence, the output of the comparator transitions to a logic one state which is reflected at the output of OR gate 43 to command an additional increment. Simultaneously, the comparator output is applied through inverter 54 to close gate 55 to further triggering of counter 38.

With comparator 36 in coincidence, the frequency bandwidth window in which the selected frequency is located has been reached. Thus, the system enters into a dither mode as shown in column 13 of Table I in response to frequency marker signals continually applied along channel 46 to clock flip-flop 39d. When the signal processor 18 indicates a picture present condition by raising AGC line 60 to a logic one state, a logic zero state occurs at the output of NAND gate 32 which causes the control of ramp generator 31 to be transferred from dither control unit 39 to the AFC channel 58 of signal processor 18. As CMOS switch 59 of FIG. 1 is closed when the output of NAND gate 32 lowers to a logic zero state, the AFC loop takes over control of the ramp generator 31 to track the selected signal.

Should the picture within a channel be lost, the AGC channel 60 transitions to a logic zero state to transfer the control of ramp generator 31 back to dither control unit 39. The generator then is placed in a dither mode within the selected channel window until a picture is reacquired.

In accordance with the invention, there is provided a tuning system adaptable to low cost integrated circuit or I²L/bipolar VLSI construction in which a selected frequency is automatically acquired and retained by the miltiloop control of a variable, voltage-controlled oscillator having a wide frequency range. The control loops employed during the tune mode operate asynchronously to permit manual control without imposing critical time responses in carrying out a tuning operation. A manually actuated keyboard is provided to select a frequency of operation located from a reference frequency a predetermined number of frequency markers retained in a storage means. An interferometer, preferably an SWD, channelizes the VCO operating band into frequency windows defined by adjacent frequency markers. Acquisition of a selected frequency is accomplished by incrementing the VCO oscillation frequency a number of frequency windows corresponding to an associated number in the storage means, and counting the frequency markers generated by the SWD as a ramp generator drives the VCO upward from a reference marker. When the frequency marker count equals the storage means content, control is transferred from an acquisition to an AFC control loop.

In one embodiment, the interferometer 47 employed an SWD of the following parameters indicated in FIG. 3:

| | | |
|---|---|---|
| a | 0.03277 | inch |
| b | 0.12723 | inch |
| c | 0.0480 | inch |
| d | 0.010×0.010 | inch |
| e | 0.063 | inch |
| f | 0.250 | inch |

The fingers were 0.000001 inch wide on 0.000002 inch centers.

Having described the invention in connection with certain specific embodiments thereof, it is to be understood that further modifications may now suggest themselves to those skilled in the art and it is intended to cover such modifications as fall within the scope of the appended claims.

What is claimed is:
1. In a tuner system, the combination comprising:
   a. a variable frequency oscillator to be connected in a frequency lock loop,
   b. a monotonic ramp voltage generator connected to control the frequency of operation of said oscillator,
   c. detector means including an interferometer of an SWD type connected to said oscillator to produce output markers at selected frequencies across a plurality of channel bands over which said oscillator frequency is driven,
   d. counter means to count said markers as said ramp generator drives said oscillator frequency away from a reference frequency.
   e. storage means having codes stored therein corresponding to the band difference between a reference frequency marker and a target band which includes a selected frequency therein,
   f. comparator means responsive to said counter means and to said storage means connected to cause said ramp generator to vary said oscillator frequency until said selected frequency is reached, and
   g. means operable when said selected frequency is reached to transfer control of said ramp generator to said frequency lock loop.

2. The tuner of claim 1 in which said SWD produces marker outputs at equally spaced intervals over the range of said oscillator.

3. The tuner of claim 1 in which said interferometer has a pair of electrode sets spaced to produce output signals which combine to produce markers at uniform points on the frequency scale.

4. A frequency tuning system which comprises:
   a. a variable, voltage controlled oscillator,
   b. an acquisition feedback loop for controlling the oscillation frequency of said oscillator in acquiring a selected frequency, said acquisition loop including i. marker means for generating frequency markers at equal band intervals across the operational frequency range of said oscillator, and ii. a monotonic ramp voltage generator connected to said marker means and said oscillator to control the frequency of operation of said oscillator c. initiating means for generating a reference frequency marker from the output of said oscillator to begin a tuning operation, d. storage means having stored therein a number of bands between said reference marker and a target band having said selected frequency therewithin, e. process means to count the number of frequency markers generated after generation of said reference frequency marker and to produce a control signal upon coincidence between the number of counted frequency bands and the contents of said storage means, f. dither means responsive to said control signal for bidirectionally driving said ramp generator over said target and between adjacent pairs of said frequency markers, g. a frequency tracking feedback loop for producing a tracking error signal to drive said ramp generator, and h. means for transferring control of said generator from said acquisition loop to said frequency tracking loop when under control of said dither means said selected frequency is acquired, wherein said marker means includes a series circuit comprising an interferometer and a low level detector connected between the output of said oscillator and said dither means, said interferometer being of an SWD type with interdigitated output transducers spaced to produce frequency markers at equal intervals across the range of said oscillator.

5. The combination set forth in claim 4 wherein said dither means includes a plurality of positive edge triggered D flip-flops logically interconnected to force said generator in a clockwise dither mode between adjacent pairs of said frequency markers.

6. In a tuning system, the combination which comprises:

a. an operator control loop including i. a manually actuated keyboard for designating a frequency of operation, and ii. storage means responsibe to said keyboard having stored therein codes corresponding to the number of bands between a reference frequency marker and a target band having a designated frequency therein, b. a frequency acquisition loop for locating said designated frequency including i. a voltage controlled oscillator, ii. marker means for generating frequency markers at equal intervals across the operational range of said oscillator to demarcate said bands, iii. a ramp voltage generator for driving said oscillator, iv. dither means responsive to said frequency markers for varying the ramp voltage from said ramp voltage generator, and v. process means for comparing the number of frequency markers generated as said generator drives the frequency of said oscillator towards said designated frequency and the code in said storage means corresponding to said designated frequency, c. a frequency lock loop adapted to control said generator to maintain the frequency of said oscillator at said designated frequency, and d. means for transferring control of said generator from said acquisition loop to said frequency lock loop as said dither means vary said oscillator over frequencies within said target band, Wherein said marker means is an SWD interferometer having interdigitated output transducers spaced and interconnected for channelizing the range of said oscillator.

7. In a tuning system, the combination which comprises:

a. an operator control loop including i. a manually actuated keyboard for designating a frequency of operation, and ii. storage means responsive to said keyboard having stored therein codes corresponding to the number of bands between a reference frequency marker and a target band having a designated frequency therein, b. a frequency acquisition loop for locating said designated frequency including i. a voltage controlled oscillator, ii. marker means for generating frequency markers at equal intervals across the operational range of said oscillator to demarcate said bands, iii. a ramp voltage generator for driving said oscillator, iv. dither means responsive to said frequency markers for varying the ramp voltage from said ramp voltage generator, and v. process means for comparing the number of frequency markers generated as said generator drives the frequency of said oscillator towards said designated frequency and the code in said storage means corresponding to said designated frequency, c. a frequency lock loop adapted to control said generator to maintain the frequency of said oscillator at said designated frequency, and d. means for transferring control of said generator from said acquisition loop to said frequency lock loop as said dither means vary said oscillator over frequencies within said target band, Wherein said dither means comprises a positive edge triggered D flip-flop logic network.

8. The combination set forth in claim 6 wherein said dither means comprises a positive edge triggered D flip-flop logic network.

9. In tuning a receiver by varying the frequency of a local oscillator the method which comprises:

a. storing a code representative of a selected frequency band within which a selected channel is located from a plurality of frequency bands, b. varying monotonically the frequency of said oscillator from a reference frequency at one extremity of a selected frequency range successively to traverse said frequency bands, c. generating a frequency marker at the margin of each said band, d. counting said frequency markers, e. comparing the number of frequency markers counted with the stored code to generate a control state, f. in response to said control state, establishing a patterned control for said ramp voltage to cause it to dither between the limits of said selected band until a signal is encountered at said selected frequency within said selected band, and
g. locking said oscillator at the frequency required for continued reception of said signal, Wherein acoustic waves generated at the oscillator frequency are sensed at spaced wave locations and two resultant functions are mixed to produce output function nulls at equally spaced frequencies across said range to provide a frequency marker at the margin of each band.

* * * * *